(12) United States Patent
Kusunoki

(10) Patent No.: US 7,368,985 B2
(45) Date of Patent: May 6, 2008

(54) HIGH FREQUENCY POWER AMPLIFIER AND TRANSMITTER

(75) Inventor: Shigeo Kusunoki, Kanagawa (JP)

(73) Assignee: Sony Ericsson Mobile Communications Japan, Inc., Tokyo (JP)

( * ) Notice: Subject to any disclaimer, the term of this patent is extended or adjusted under 35 U.S.C. 154(b) by 162 days.

(21) Appl. No.: 11/227,665

(22) Filed: Sep. 15, 2005

(65) Prior Publication Data
US 2006/0061416 A1    Mar. 23, 2006

(30) Foreign Application Priority Data
Sep. 17, 2004  (JP)  ............... P2004-270804

(51) Int. Cl.
H03F 3/38 (2006.01)
(52) U.S. Cl. .................. 330/10; 330/136
(58) Field of Classification Search .......... 323/268, 323/269, 272
See application file for complete search history.

(56) References Cited
U.S. PATENT DOCUMENTS 6,445,247 B1 * 9/2002 Walker ................ 330/10
6,987,417 B2 * 1/2006 Winter et al. ........ 330/10

FOREIGN PATENT DOCUMENTS
JP       2004 48798      2/2004

* cited by examiner

Primary Examiner—Benny Lee
Assistant Examiner—Alan Wong
(74) Attorney, Agent, or Firm—Frommer Lawrence & Haug LLP; William S. Frommer; Thomas F. Presson (57) ABSTRACT

Disclosed is a digital signal processing portion that amplifies a high frequency signal resulting from digitally modulating data to be transmitted. An envelope detection portion (DETenv) generates the high frequency signal's envelope voltage. A comparator compares this envelope voltage with reference voltage Vref to generate two-state output. According to this two-state output, a power converter circuit converts power supply voltage Vbatt into power and outputs power supply voltage Vpa for a power amplifier. While the envelope voltage is larger than the reference voltage Vref, for example, the power supply voltage Vpa is changed from voltage V1 to V2 (larger than V1). In this manner, there are provided a high frequency power amplifier and a transmitter capable of decreasing distortion of transmission signals by means of a relatively simple technique.

10 Claims, 6 Drawing Sheets

HIGH FREQUENCY POWER AMPLIFIER AND TRANSMITTER

CROSS REFERENCES TO RELATED APPLICATIONS

The present invention contains subject matter related to Japanese Patent Application JP 2004-270804 filed in the Japanese Patent Office on Sep. 17, 2004, the entire contents of which being incorporated herein by reference.

BACKGROUND OF THE INVENTION

1. Field of the Invention

The present invention relates to a high frequency power amplifier and particularly to a high frequency power amplifier usable for a transmitter in a communication system such as a cellular phone.

2. Description of Related Art

In recent and future years, code multiplexing is performed for signals transmitted by a so-called third generation cellular phone for the purpose of acceleration and sophistication of data. In this case, there occurs an increase in a ratio of maximum momentary power to an average power (peak factor). Consequently, distortion occurring in a power amplifier increases to increase an adjacent channel interference. There may be a case of providing acceleration by keeping the code multiplexing count constant. In such case, there arises a need to increase the transmission power so as to keep the S/N ratio constant in a reception portion. In this case, an average power increases to increase the gain compression applied to a maximum momentary power portion and to increase the distortion power.

SUMMARY OF THE INVENTION

Under the above-mentioned technological environment, a power amplifier used for cellular phones demands more linearity than ever. A technology for distortion compensation is effective for linearizing the power amplifier, for example. However, cellular phones are continuously miniaturized. There has been the chronic problem that using a complicated technique is difficult.

To address this problem, there are provided communication apparatuses equipped with the power amplifier as described in JP-A No. 48798/2004, for example. The JP-A No. 48798/2004 exemplifies the invention of the linearizer using diodes and the like. However, the invention is practically problematic because it is very difficult for the linearizer to match its temperature characteristic and the like with those of the power amplifier subject to the distortion compensation.

There is known another power amplifier that uses the method other than the distortion compensation. In such power amplifier, a plurality of transistors is parallel connected. The linearity is maintained by increasing the number of transistors to be operated as the output power increases. However, such power amplifier generates a synthesis noise because transistor outputs are discretely synthesized. It is difficult to sufficiently decrease the distortion power in the frequency zone where a detuning frequency is large.

The present invention has been made in consideration of the foregoing. It is desirable to provide a high frequency power amplifier and a transmitter capable of decreasing transmission signal distortion using a relatively easy technique.

A high frequency power amplifier according to an embodiment of the present invention includes: a power amplifier to amplify a digitally modulated high frequency signal; an envelope detection portion to generate an envelope signal equivalent to an envelope voltage for the high frequency signal; a comparator to compare the envelope signal with a specified reference signal; and a power converter circuit to convert a power supply voltage into power in accordance with an output from the comparator, wherein a voltage output from the power converter circuit is used as a power supply voltage for the power amplifier.

In accordance with an output from the comparator, the power converter circuit selectively outputs the first voltage and the second voltage higher than the first voltage based on the power supply voltage. Specifically, when an envelope signal becomes higher than the reference signal, the circuit can change the power amplifier's power supply voltage. As a result, it is possible to decrease the distortion of a transmission signal in the maximum momentary power portion.

The envelope detection portion can be constructed by a detection circuit which functions to remove a high frequency signal and output only an envelope component. Alternatively, the envelope detection portion can be constructed by a digital signal processing portion to generate the digitally modulated high frequency signal.

A fixed reference voltage can be used as the specified reference signal. Alternatively, the high frequency power amplifier can have an average value detection portion to output an average power voltage having a frequency approximate to direct current equivalent to an average power of the high frequency signal and can use an average power voltage output from the average value detection portion as the specified reference signal. In the latter case, it is desirable the high frequency power amplifier should have a switch to change between an output from the average value detection portion and a specified reference voltage in accordance with magnitude of the average power voltage and use an output from this switch as the specified reference signal.

A transmitter according to an embodiment of the present invention includes: a digital signal processing portion to generate a high frequency signal resulting from digitally modulating data to be transmitted; a band pass filter to pass signals with a specified band output from the digital signal processing portion; a power amplifier to amplify an output from the band pass filter; an envelope detection portion to generate an envelope signal equivalent to an envelope voltage of the high frequency signal; a comparator to compare the envelope signal with a specified reference signal; and a power converter circuit to convert a power supply voltage into power in accordance with an output from the comparator, wherein a voltage output from the power converter circuit is used as a power supply voltage for the power amplifier.

The high frequency power amplifier and the transmitter according to an embodiment of the present invention allows the maximum momentary power portion for an envelope of a signal to be amplified to increase a power supply voltage applied to the power amplifier. This makes it possible to decrease the distortion occurring in the maximum momentary power. Only the maximum momentary power portion dynamically controls to increase the power supply voltage, thus slightly suppressing an increase in the overall power consumption.

BRIEF DESCRIPTION OF THE DRAWINGS

Embodiments of the present invention will be described in detail based on the following figures, wherein.

DETAILED DESCRIPTION OF THE PREFERRED EMBODIMENTS

Embodiments of the present invention will be described in further detail with reference to the accompanying drawings.

The following concisely describes the principle that enables the present invention to decrease distortion. A digitally modulated high frequency signal is distorted in the power amplifier because its maximum momentary power portion is subject to the power amplifier's gain compression. Accordingly, when the maximum momentary power portion is subject to the gain compression, increasing a voltage supplied to the power amplifier can decrease the gain compression at that time to improve the distortion.

Figure 1:
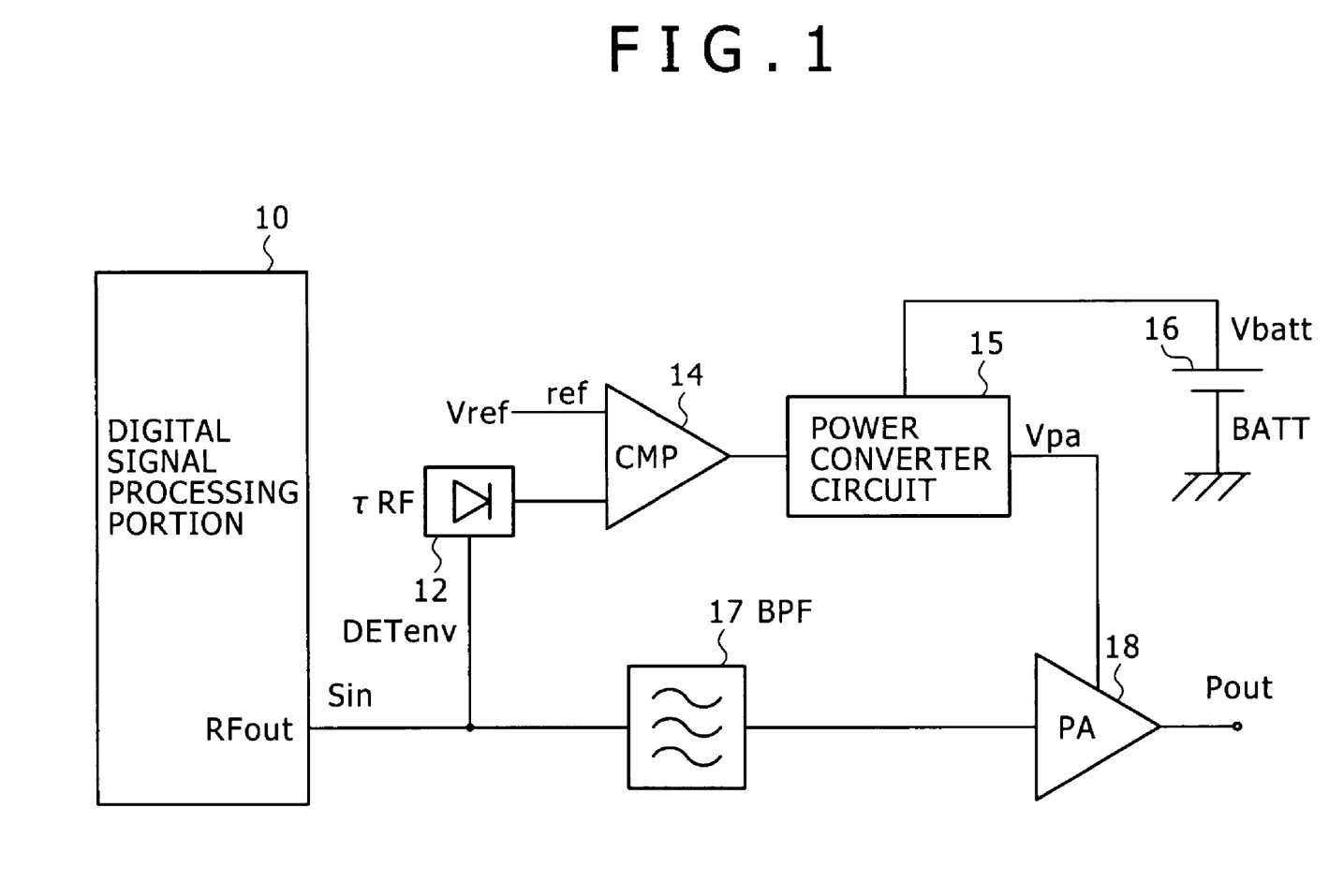
FIG. 1 is a block diagram showing the configuration of a transmitter including a high frequency power amplifier according to a first embodiment of the present invention.

FIG. 1 is a block diagram showing the configuration of a transmitter including a high frequency power amplifier according to a first embodiment of the present invention. The following describes this configuration. In FIG. 1, a digital signal processing portion 10 outputs a high frequency signal Sin that is generated by digitally modulating data to be transmitted. The high frequency signal Sin is branched into two portions. One is input to an envelope detection portion (DETenv) 12. The other passes through a band pass filter (BPF) 17 and is supplied to a high frequency power amplifier (PA) 18. The band pass filter (BPF) 17 passes signals corresponding to a specified band. An output terminal Pout of the high frequency power amplifier 18 is connected to an antenna (not shown) via an antenna duplexer (not shown). The envelope detection portion (DETenv) 12 can be constructed of a normal detection circuit using diodes. The envelope detection portion (DETenv) 12 is assigned a short time constant τRF and functions so as to remove high frequency signals and output only envelope components.

An output from the envelope detection portion (DETenv) 12 is input to one of two input terminals of a comparator (CMP) 14 to be described later. The comparator 14 generates two-state output. The other terminal ref of the comparator 14 is always supplied with reference voltage Vref. The comparator 14 compares voltages at the two inputs and outputs a first level (low voltage in this example) or a second level (high voltage in this example) according to a comparison result. In this example, the comparator 14 outputs a high voltage when an output from the envelope detection portion 12 is larger than the reference voltage Vref. The comparator output is input to a power converter circuit 15 having an output control terminal. The power converter circuit 15 receives power supply voltage Vbatt from a power supply (BATT) 16 that supplies main power. The power converter circuit 15 converts the power supply voltage Vbatt into the electric power and applies it to the high frequency power amplifier 18. Specifically, when a comparator output is low (i.e., when an output from the envelope detection portion 10 is smaller than the reference voltage Vref), the power converter circuit 15 supplies first power supply voltage V1 to the high frequency power amplifier 18. By contrast, when a comparator output is high, the power converter circuit 15 supplies the high frequency power amplifier 18 with second power supply voltage V2 higher than the first power supply voltage V1. In this example, the second power supply voltage V2 is generated by boosting the power supply voltage Vbatt. For example, the power supply (BATT) 16 corresponds to a cellular phone's lithium-ion battery and supplies an average output voltage of 3.5 V. According to the embodiment, the first power supply voltage V1 is 3.2 V. The second power supply voltage V2 is 4.2 V.

Figure 2:
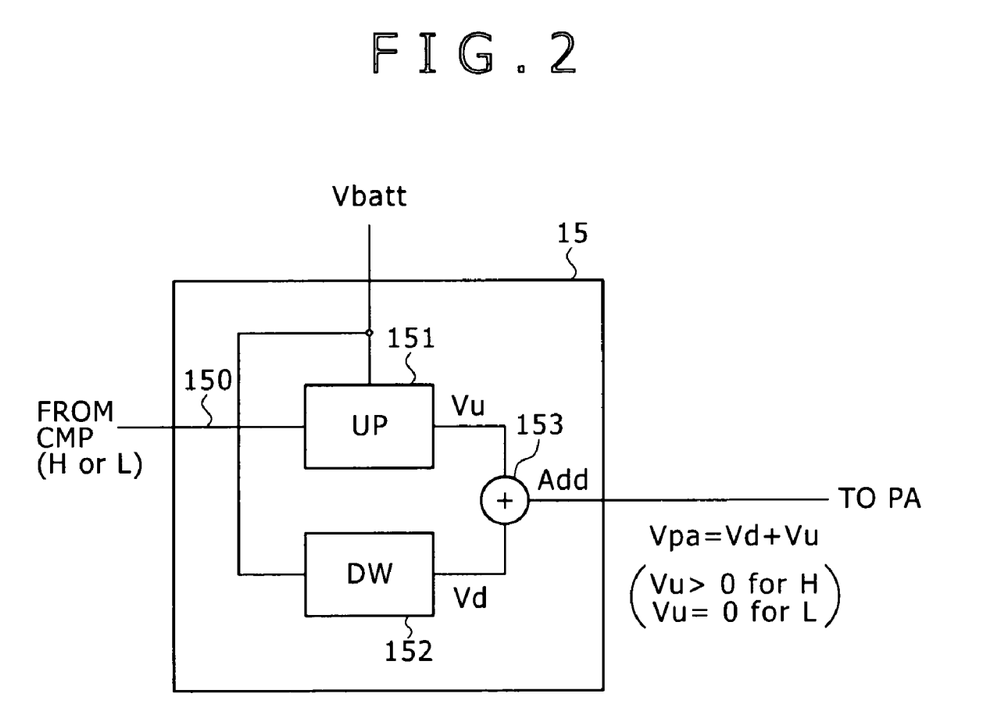
FIG. 2 is a block diagram exemplifying the internal circuit configuration of a power converter circuit according to the embodiment of the present invention.

FIG. 2 exemplifies the internal circuit configuration of the power converter circuit 15. According to this configuration example, the power converter circuit 15 is composed of a DC-DC converter (UP) 151 having an output control terminal 150, a second DC-DC converter (DW) 152, and a voltage adder (Add) 153 to add output voltages from both DC-DC converters 151 and 152 to each other. These DC-DC converters connect with a power supply (BATT) to supply main power. An output from the voltage adder Add is connected to a power supply terminal of the power amplifier PA.

When a voltage of the output control terminal 150 is low, the DC-DC converter (UP) 151 outputs 0 voltages (i.e., outputs nothing), keeping the output impedance high. When a voltage of the output control terminal 150 is high, the DC-DC converter (UP) 151 outputs additional voltage Vu. This additional voltage Vu is set to approximately 1 V, for example. On the other hand, the second DC-DC converter (DW) 152 always outputs the same output direct current voltage Vd in accordance with the power supply voltage Vbatt as an input direct current voltage. The embodiment sets Vd to 3.2 V. The voltage adder (Add) 153 adds outputs from the first and second DC-DC converters 151 and 152 to each other and outputs power supply voltage Vpa (V1 or V2) for the power amplifier (PA) 18.

Figure 3:
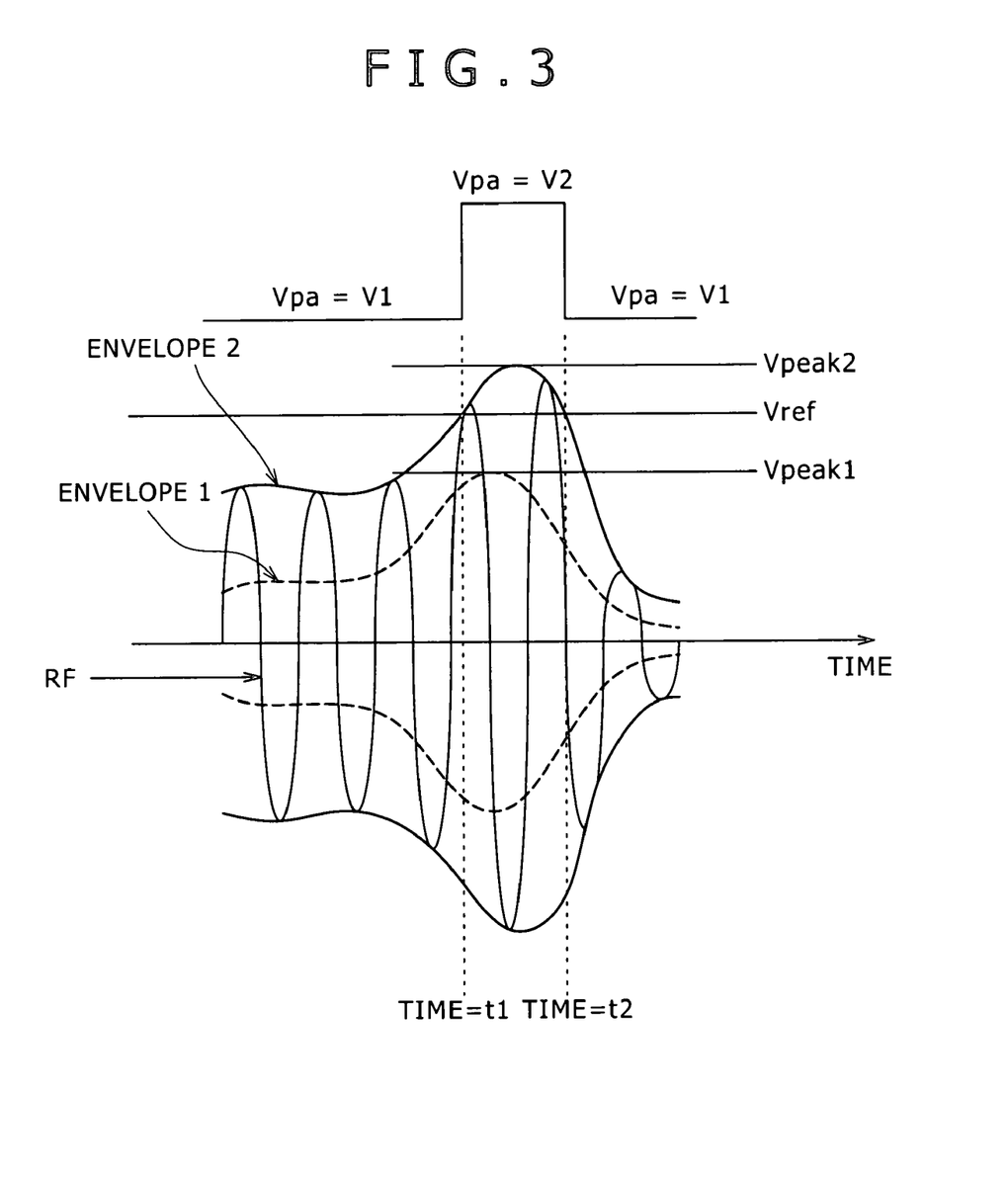
FIG. 3 is a waveform diagram showing operations of the circuit in FIG. 1.

The following describes operations of the circuit in FIG. 1 with reference to a waveform diagram as shown in FIG. 3. FIG. 3 simulates time waveforms of digitally modulated high frequency signals supplied to the power amplifier (PA) 18 in the circuit as shown in FIG. 1. The state of an envelope 1 shows a case where a small high frequency signal Sin is input to the power amplifier 18. In this case, a voltage equivalent to the maximum momentary power is represented as Vpeak1. As shown in FIG. 3, the comparator's reference voltage Vref is set so as to satisfy the condition Vref>Vpeak1.

In this state, since a comparator input of the envelope 1 is always smaller than Vref, an output thereof becomes low. Accordingly, an output from the voltage adder (Add) 153 is always maintained to be an output of 3.2 V from the DC-DC converter (DW) 152.

Let us assume that the input signal Sin increases, a voltage equivalent to the maximum momentary power corresponds to Vpeak2, and the envelope voltage corresponds to an envelope 2. In this case, as shown in FIG. 3, a comparator input (envelope 2) becomes larger than Vref between times t1 and t2. During this period, a comparator output goes high. The DC-DC converter (UP) 151 operates to output additional voltage Vu (non-zero). Accordingly, the voltage adder (Add) 153 outputs Vpa=Vd+Vu=4.2V. In a high envelope voltage portion, the power supply voltage Vpa applied to the power amplifier (PA) 18 is boosted to 4.2 V. As a result, the distortion appearing in a power amplifier output decreases compared to the condition of Vpa=3.2V.

Figure 4:
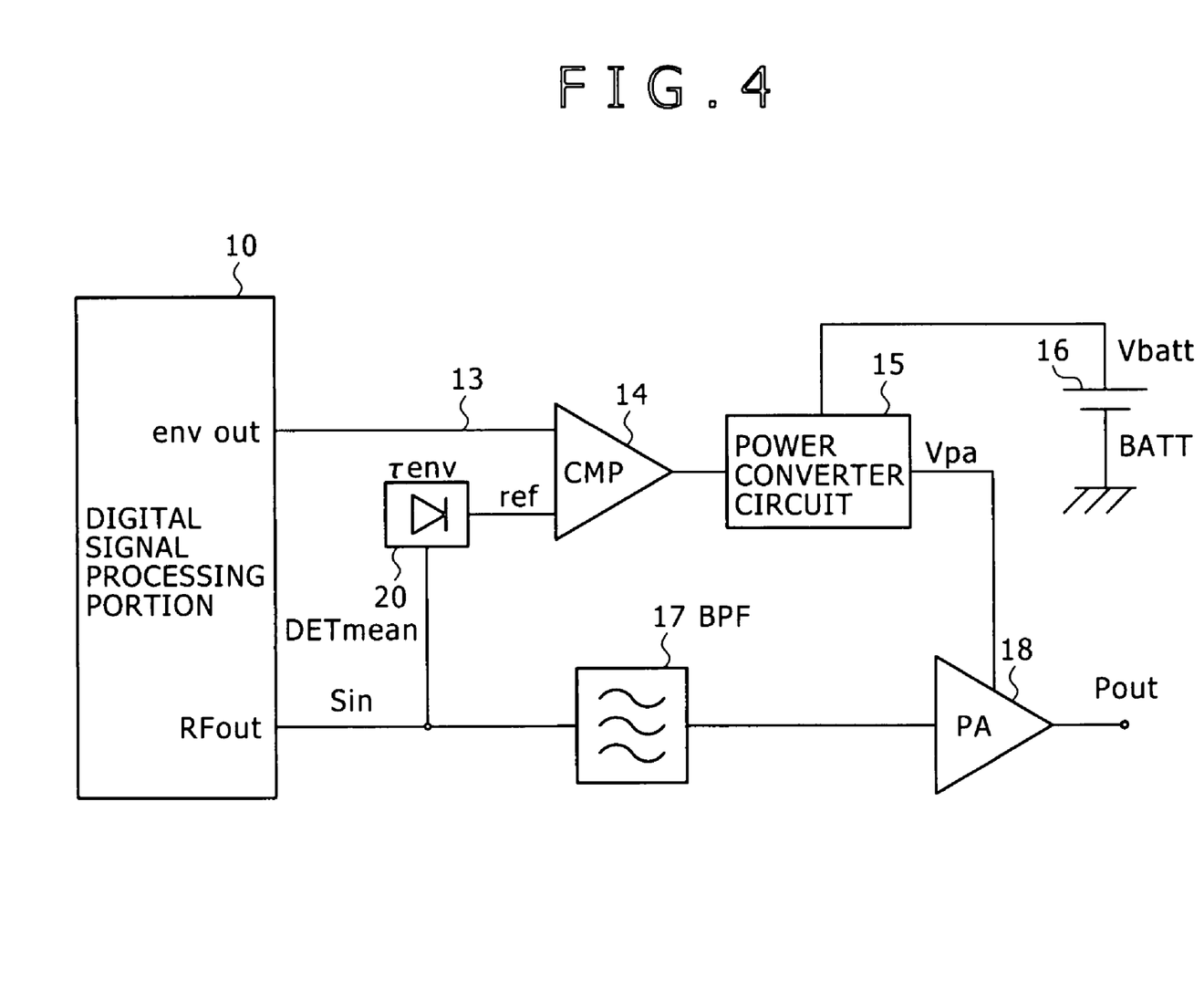
FIG. 4 is a block diagram showing the configuration of a transmitter including a high frequency power amplifier according to a second embodiment of the present invention.

The following describes a second embodiment of the present invention. FIG. 4 is a block diagram showing the configuration of a transmitter including a high frequency power amplifier according to the second embodiment. The mutually corresponding constituent elements in FIGS. 4 and 1 are designated by the same reference numerals.

According to the first embodiment, the envelope detection portion 12 generates an envelope voltage based on the digitally modulated high frequency signal Sin from the digital signal processing portion 10. According to the second embodiment, the digital signal processing portion 10 generates an envelope voltage 13 based on a signal before it is digitally modulated. An average value detection portion (DETmean) 20 generates a reference voltage applied to the input terminal ref of the comparator (CMP) 14 based on a digitally modulated high frequency signal output from the digital signal processing portion 10. The average value detection portion (DETmean) 20 is a circuit to detect a voltage (average power supply voltage) equivalent to the high frequency signal's average power. The average value detection portion (DETmean) 20 can be constructed as an ordinary detection circuit using diodes and is assigned its time constant τenv configured to be long. The average value detection portion (DETmean) 20 removes high frequency signals and envelope components and outputs a voltage approximate to direct current equivalent to the average power. The other parts of the configuration are the same as those of the configuration as shown in FIG. 1 and a duplicate description is omitted.

According to this configuration, the comparator (CMP) 14 compares the envelope voltage 13 output from the digital signal processing portion 10 with an output from the average value detection portion (DETmean) 20. In accordance with a comparison result, the comparator (CMP) 14 outputs a high or low voltage. The power converter circuit 15 operates in accordance with comparator outputs as described in the first embodiment.

Figure 5:
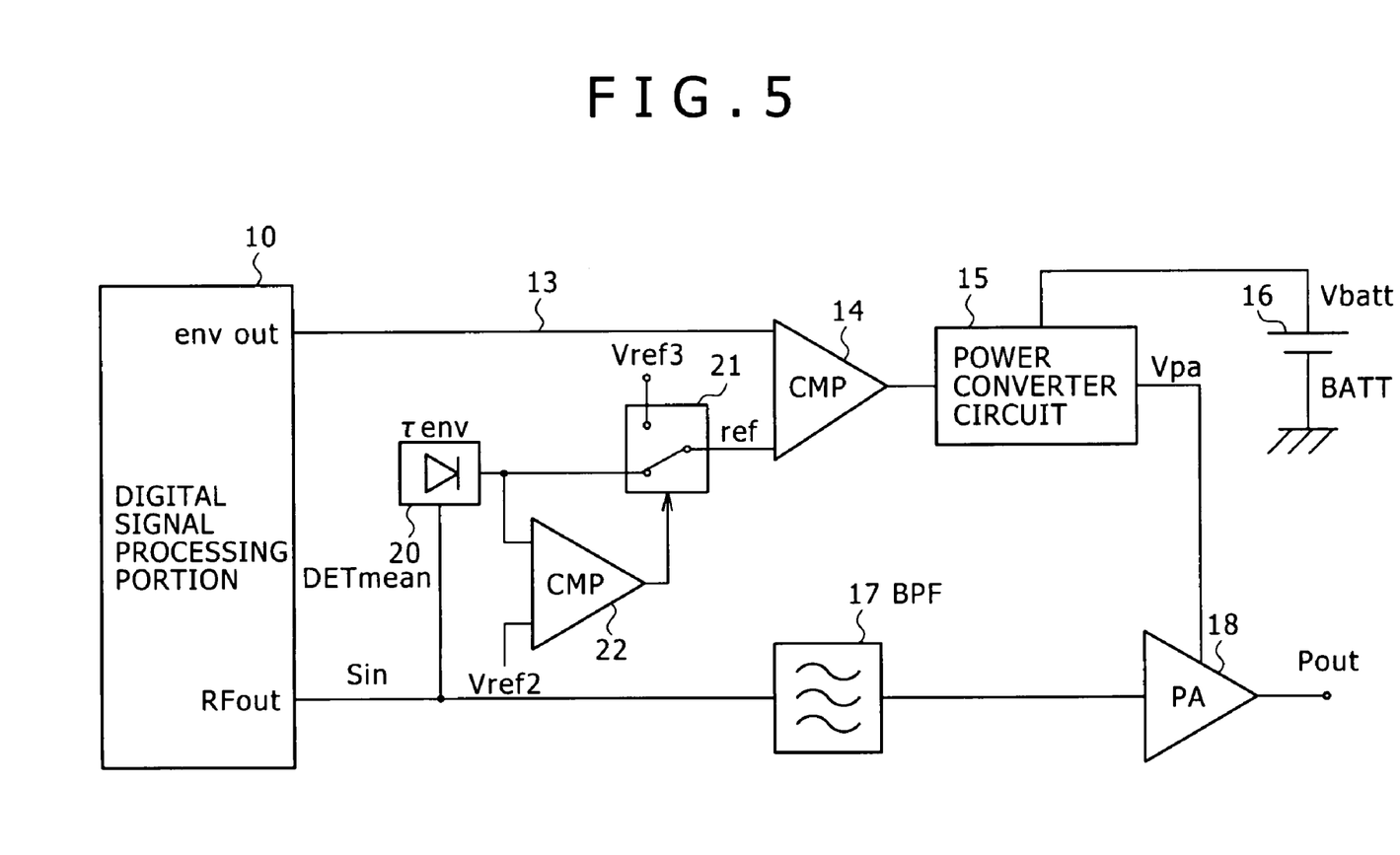
FIG. 5 is a block diagram exemplifying an improvement of the transmitter including the high frequency power amplifier as shown in FIG. 4.

FIG. 5 exemplifies an improvement of the configuration as shown in FIG. 4. The configuration in FIG. 4 shows the example of directly using an output from the average value detection portion (DETmean) 20 as the reference voltage for the comparator 14. In this case, the reference voltage may become too low. To solve this problem, the configuration in FIG. 5 allows another comparator 22 to compare an output from the average value detection portion (DETmean) 20 with a specified reference voltage Vref2. When the output is lower than the reference voltage Vref2, a specified reference voltage Vref3 is used as the reference voltage for the comparator 14. When the output is higher than or equal to the reference voltage Vref2, an output from the average value detection portion (DETmean) 20 is used as the reference voltage for the comparator 14. A switch 21 is used to change these states. The reference voltage Vref2 may be the same as the reference voltage Vref3.

It may be preferable to allow the digital signal processing portion 10 to detect a certain degree of average level for input signals. In accordance with a detection result, the digital signal processing portion 10 may generate a switch control signal for the switch 21. In this case, the comparator 22 becomes unnecessary.

Figure 6:
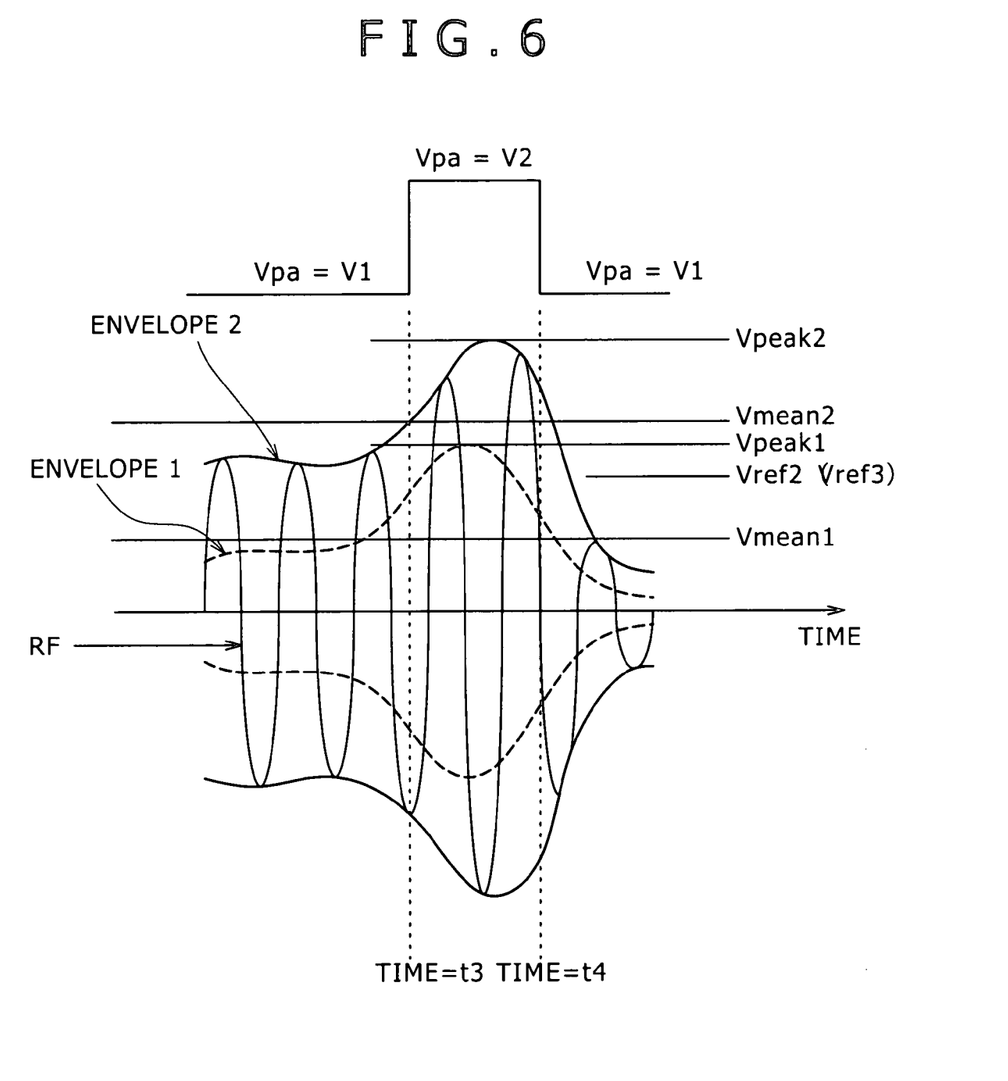
FIG. 6 is a waveform diagram showing operations of the circuit in FIG. 5.

The following describes operations of the circuit in FIG. 5 with reference to the waveform diagram in FIG. 6. The mutually corresponding constituent elements in FIGS. 6 and 3 are designated by the same reference numerals. The state of the envelope 1 shows a case where the high frequency signal Sin is small. A voltage equivalent to the average power is represented as Vmean1. A voltage equivalent to the maximum momentary power is represented as Vpeak1. The example in FIG. 6 shows that the reference voltage Vref2 equals the reference voltage Vref3.

This state permits a period in which a comparator input of the envelope 1 becomes larger than Vmean1. Since Vmean1 is always smaller than Vref2, Vref3 is used as the reference voltage for the comparator 14. Since the comparator input (envelope 1) is always smaller than Vref3, a comparator output always remains the low level. As a result, an output of the voltage adder (Add) 153 always keeps 3.2 V output from the DC-DC converter (DW) 152.

Let us assume that the input signal Sin increases, the average power is equivalent to Vmean2, the maximum momentary power is equivalent to Vpeak2, and the envelope voltage corresponds to the envelope 2. In this case, Vmean2 becomes greater than Vref2. Vmean2 is used as the reference voltage for the comparator 14. The comparator input (envelope 2) becomes greater than Vref3 between the times t3 and t4. Accordingly, a comparator output goes high during this period. The power converter circuit 15 outputs Vpa=Vd+Vu=4.2V. In a high envelope voltage portion, the power supply voltage Vpa applied to the power amplifier is boosted to 4.2 V. As a result, the distortion appearing in a power amplifier output decreases compared to the condition of Vpa=3.2V.

An SAW filter can be used as the band pass filter (BPF) 17 connected previously to the power amplifier 18. The SAW filter causes a long group delay time and can ensure a response time delay from an input to the comparator 14 to an output from the power converter circuit 15 as mentioned above.

When the power supply voltage Vpa for the power amplifier 18 increases from 3.2 V to 4.2 V, a gain of the power amplifier 18 may slightly increase. In such case, the digital signal processing portion 10 can correct the variation gain.

When the first and second embodiments are compared, a major difference between them can be stated as follows. The reference voltage supplied to the comparator 14 is fixed according to the first embodiment but varies with an input signal according to the second embodiment. Input signals processed by the high frequency power amplifier can vary with communication systems to be applied. For example, a peak factor is equivalent to the maximum momentary power (peak power) for the average power of input signals. There is a large difference between peak factors for the present cellular phone communication systems (W-CDMA, CDMA2000, FOMA, HDR, and the like) and for the other communication systems using the orthogonal frequency division multiplexing (OFDM) modulation system used for wireless LANs and the like. That is, the peak factor for the latter is several times greater than that for the former. According to the present invention, it is not always appropriate to equally treat input signals with different characteristics. Specifically, the configuration in FIG. 1 is suitable for the communication systems such as OFDM featuring relatively large peak factors. The configuration in FIG. 5 is suitable for the communication systems such as the present cellular phone communication systems featuring relatively small peak factors.

While there have been described specific preferred embodiments of the present invention, it is to be distinctly understood that the present invention may be otherwise variously modified and changed within the spirit and scope of the invention.

For example, it may be preferable to use an envelope voltage obtained from the digital signal processing portion 10 according to the second embodiment instead of the envelope detection portion 12 according to the first embodiment. Alternatively, the reverse is also possible.

It should be understood by those skilled in the art that various modifications, combinations, sub-combinations and alterations may occur depending on design requirements and other factors insofar as they are within the scope of the appended claims or the equivalents thereof.

What is claimed is:

1. A high frequency power amplifier comprising:
   a power amplifier to amplify a digitally modulated high frequency signal;
   an envelope detection portion to generate an envelope signal equivalent to an envelope voltage for the high frequency signal;
   a comparator to compare the envelope signal with a specified reference signal; and
   a power converter circuit to convert a power supply voltage into power in accordance with an output from the comparator, wherein a voltage output from the power converter circuit is used as a power supply voltage for the power amplifier, wherein a fixed reference voltage is used as the specified reference signal,
   wherein the power converter circuit, in accordance with an output from the comparator, selectively outputs a first voltage and a second voltage higher than the first voltage based on the power supply voltage,
   wherein the power converter circuit includes:
   a first DC-DC converter which is supplied with a two-state output from the comparator, outputs a 0-voltage when the output is corresponds to a first level, and outputs an additional voltage when the output corresponds to a second level;
   a second DC-DC converter which always outputs the same output direct current voltage with reference to the power supply voltage; and
   a voltage adder which adds outputs from the first and second DC-DC converters to each other for output.

2. The high frequency power amplifier according to claim 1, wherein the envelope detection portion is constructed by a detection circuit which functions to remove a high frequency signal and output only an envelope component.

3. The high frequency power amplifier according to claim 1, wherein the envelope detection portion is constructed by a digital signal processing portion to generate the digitally modulated high frequency signal.

4. A high frequency power amplifier comprising:
   a power amplifier to amplify a digitally modulated high frequency signal;
   an envelope detection portion to generate an envelope signal equivalent to an envelope voltage for the high frequency signal;
   a comparator to compare the envelope signal with a specified reference signal; and
   a power converter circuit to convert a power supply voltage into power in accordance with an output from the comparator,
   wherein a voltage output from the power converter circuit is used as a power supply voltage for the power amplifier,
   wherein the high frequency power amplifier has an average value detection portion to output an average power voltage having a frequency approximate to direct current equivalent to an average power of the high frequency signal and uses an average power voltage output from the average value detection portion as the specified reference signal.

5. The high frequency power amplifier according to claim 4, wherein the high frequency power amplifier has a switch to change between an output from the average value detection portion and a specified reference voltage in accordance with magnitude of the average power voltage and uses an output from this switch as the specified reference signal.

6. A transmitter comprising:
   a digital signal processing portion to generate a high frequency signal resulting from digitally modulating data to be transmitted;
   a band pass filter to pass signals with a specified band output from the digital signal processing portion;
   a power amplifier to amplify an output from the band pass filter;
   an envelope detection portion to generate an envelope signal equivalent to an envelope voltage of the high frequency signal;
   a comparator to compare the envelope signal with a specified reference signal; and
   a power converter circuit to convert a power supply voltage into power in accordance with an output from the comparator, wherein a voltage output from the power converter circuit is used as a power supply voltage for the power amplifier, wherein a fixed reference voltage is used as the specified reference signal,
   wherein the power converter circuit, in accordance with an output from the comparator, selectively outputs a first voltage and a second voltage higher than the first voltage based on the power supply voltage,
   wherein the power converter circuit includes:
   a first DC-DC converter which is supplied with a two-state output from the comparator, outputs a 0-voltage when the output is corresponds to a first level, and outputs an additional voltage when the output corresponds to a second level;
   a second DC-DC converter which always outputs the same output direct current voltage with reference to the power supply voltage; and
   a voltage adder which adds outputs from the first and second DC-DC converters to each other for output.

7. The transmitter according to claim 6, wherein the envelope detection portion is constructed by a detection circuit which functions to remove a high frequency signal and output only an envelope component.

8. The transmitter according to claim 6, wherein the envelope detection portion is constructed by a digital signal processing portion to generate the digitally modulated high frequency signal.

9. A transmitter comprising:
   a digital signal processing portion to generate a high frequency signal resulting from digitally modulating data to be transmitted;
   a band pass filter to pass signals with a specified band output from the digital signal processing portion;
   a power amplifier to amplify an output from the band pass filter;
   an envelope detection portion to generate an envelope signal equivalent to an envelope voltage of the high frequency signal;

a comparator to compare the envelope signal with a specified reference signal; and a power converter circuit to convert a power supply voltage into power in accordance with an output from the comparator, wherein a voltage output from the power converter circuit is used as a power supply voltage for the power amplifier, wherein the transmitter has an average value detection portion to output an average power voltage having a frequency approximate to direct current equivalent to an average power of the high frequency signal and uses an average power voltage output from the average value detection portion as the specified reference signal.

10. The transmitter according to claim 9, wherein the transmitter has a switch to change between an output from the average value detection portion and a specified reference voltage in accordance with magnitude of the average power voltage and uses an output from this switch as the specified reference signal.

* * * * *